United States Patent
Strassner

(10) Patent No.: US 12,469,740 B2
(45) Date of Patent: Nov. 11, 2025

(54) VACUUM CHUCKING OF A SUBSTRATE WITHIN A CARRIER

(71) Applicant: Applied Materials, Inc., Santa Clara, CA (US)

(72) Inventor: James D. Strassner, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 289 days.

(21) Appl. No.: 18/103,302

(22) Filed: Jan. 30, 2023

(65) Prior Publication Data

US 2023/0260824 A1 Aug. 17, 2023

Related U.S. Application Data

(60) Provisional application No. 63/309,788, filed on Feb. 14, 2022.

(51) Int. Cl.
| | |
|---|---|
| *H01L 21/687* | (2006.01) |
| *B32B 3/26* | (2006.01) |
| *B32B 7/12* | (2006.01) |
| *B32B 9/04* | (2006.01) |

(52) U.S. Cl.
CPC ........ *H01L 21/68785* (2013.01); *B32B 3/266* (2013.01); *B32B 7/12* (2013.01); *B32B 9/04* (2013.01); *B32B 2307/732* (2013.01)

(58) Field of Classification Search
CPC ......... H01L 21/68785; H01L 21/67109; H01L 21/6831; H01L 21/68735; H01L 21/68771
See application file for complete search history.

(56) References Cited

U.S. PATENT DOCUMENTS

| | | | |
|---|---|---|---|
| 6,494,955 B1 * | 12/2002 | Lei | H01L 21/68785 118/724 |
| 2003/0019744 A1 * | 1/2003 | Pokorny | H01L 21/68785 204/297.01 |
| 2017/0178931 A1 * | 6/2017 | Choi | H01L 21/68735 |
| 2018/0017874 A1 * | 1/2018 | Iwatani | G03F 7/708 |
| 2018/0174884 A1 | 6/2018 | Ichinose | |

FOREIGN PATENT DOCUMENTS

| | | | | |
|---|---|---|---|---|
| JP | 2003168723 A | * | 6/2003 | |
| WO | WO-9923691 A2 | * | 5/1999 | ......... C23C 16/4581 |

OTHER PUBLICATIONS

English translation JP2003168723 (Year: 2003).*
International Search Report and Written Opinion for International Application No. PCT/US2023/011883 dated May 24, 2023.

\* cited by examiner

*Primary Examiner* — Jason L Vaughan
*Assistant Examiner* — Amanda Kreiling
(74) *Attorney, Agent, or Firm* — Patterson + Sheridan, LLP

(57) ABSTRACT

A substrate carrier and methods of assembling the substrate carrier are described herein. The substrate carrier includes a plurality of vacuum transfer channels to vacuum chuck a bottom of a substrate. The plurality of vacuum transfer channels reduce the radial position of the vacuum to enable vacuum chucking of the substrate from a radially outward vacuum position to an inward vacuum position. The substrate is positioned in a pocket on the substrate carrier. The substrate carrier is a glass material.

21 Claims, 8 Drawing Sheets

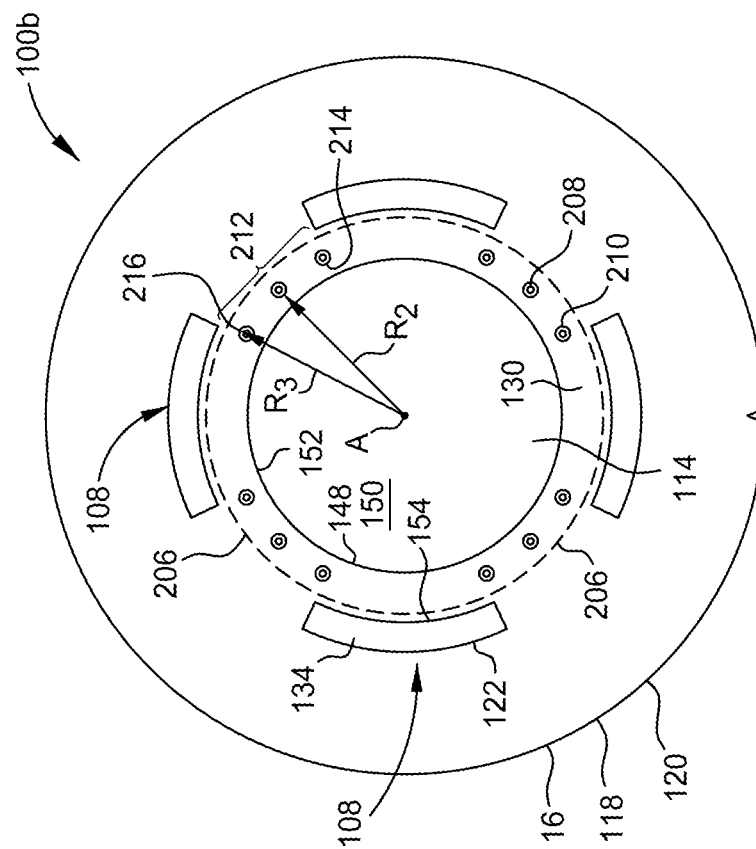
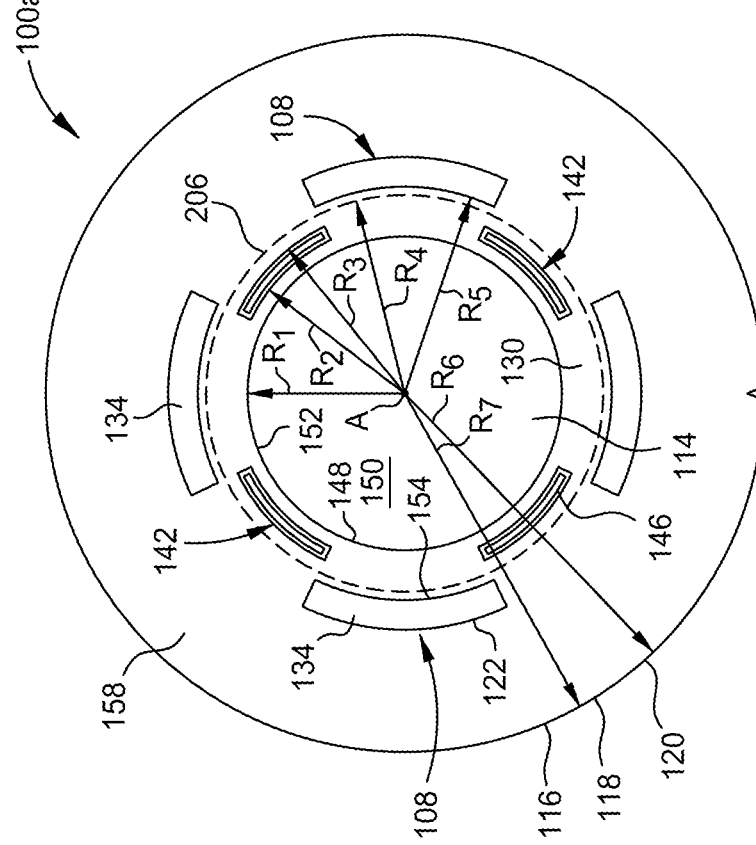
FIG. 2B
FIG. 2A

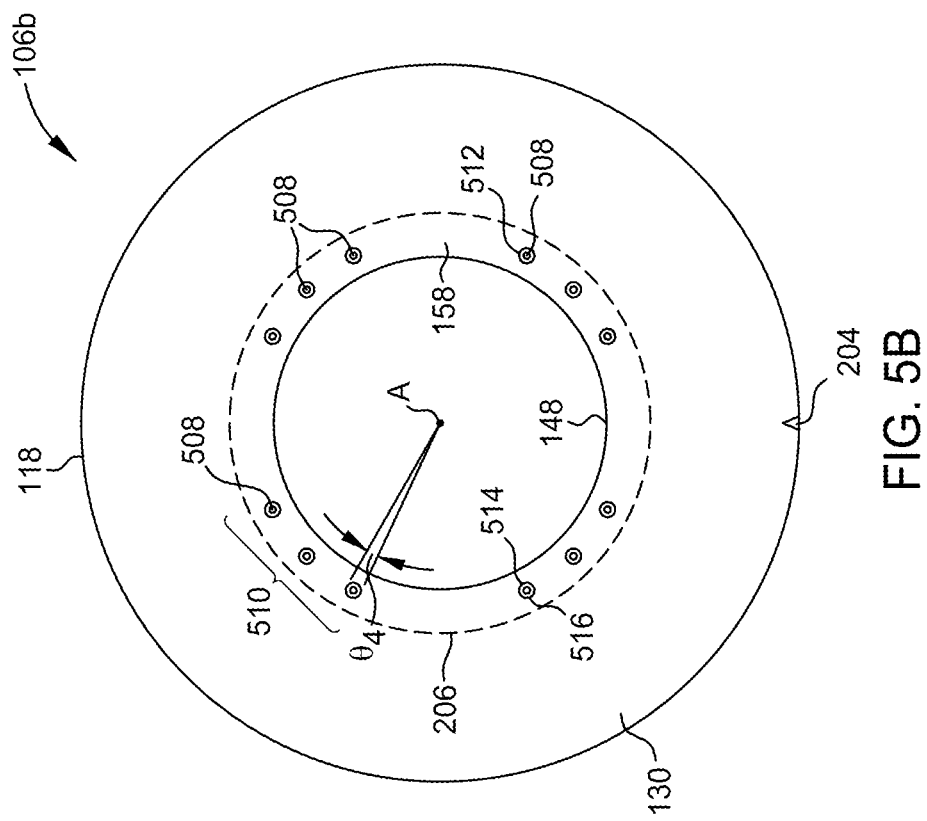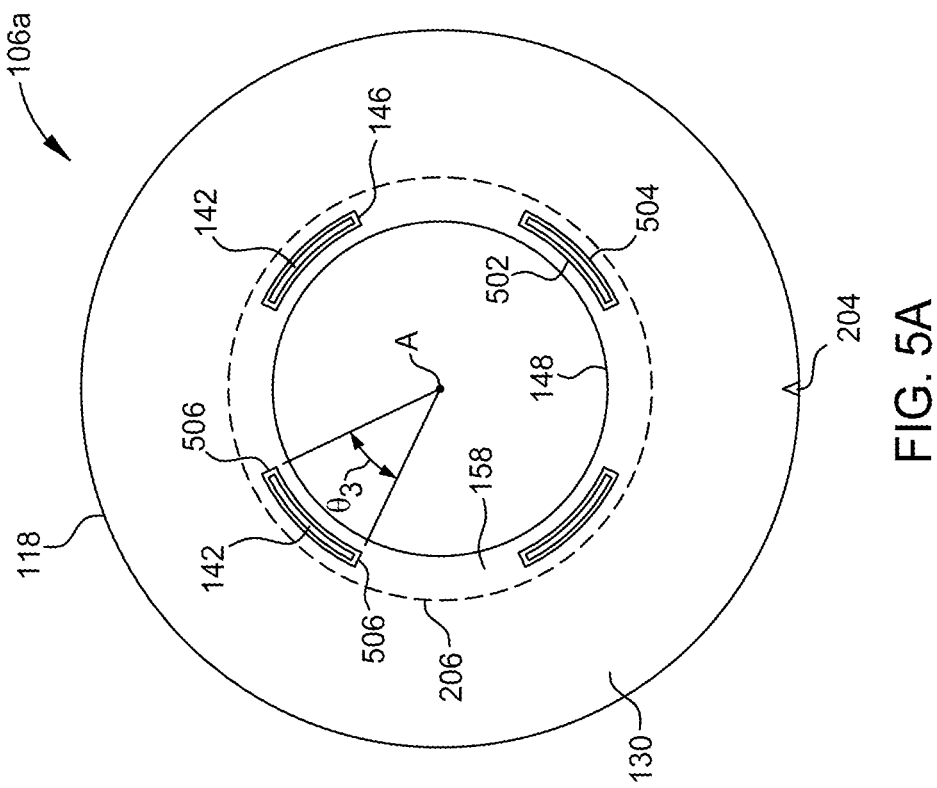

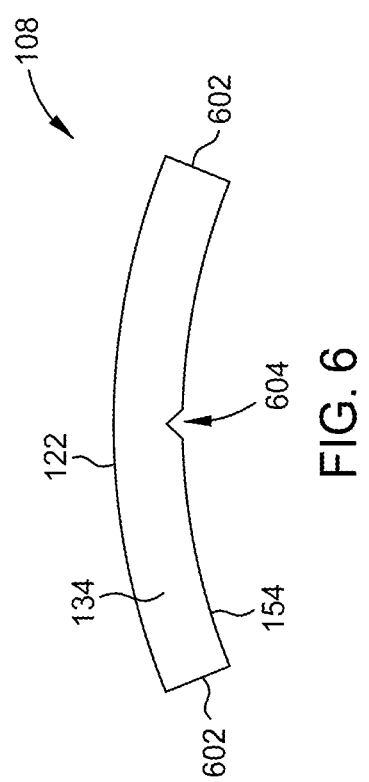

VACUUM CHUCKING OF A SUBSTRATE WITHIN A CARRIER

CROSS-REFERENCE TO RELATED APPLICATIONS

This application claims the benefit of U.S. Provisional Patent Application Ser. No. 63/309,788, filed Feb. 14, 2022, which is incorporated by reference herein in its entirety.

BACKGROUND

Field

Embodiments of the present disclosure generally relate to a carrier for transferring substrates of varying sizes between semiconductor processing chambers.

Description of the Related Art

Semiconductor processing chambers, such as deposition, etching, or annealing chambers are configured to process substrates of one particular size. In many instances, processing chambers are configured to process either a 300 mm substrate or a 200 mm substrate. However, in some applications, smaller substrates are utilized than the processing chamber is configured to process. In these instances, a processing chamber originally configured to process a 300 mm substrate would process a 200 mm, a 150 mm, or a 100 mm substrate. In another embodiment, a processing chamber originally configured to process a 200 mm substrate would process a 150 mm or a 100 mm substrate.

When smaller substrates than the processing chambers are originally configured to handle are being treated, the original transfer devices and chamber clamping mechanisms are not always compatible with the smaller substrate. However, replacing transfer devices and/or chamber clamping mechanisms within processing chambers is expensive, causes extensive downtime, and prevents quick changes between substrate sizes being processed.

Substrates with reduced sizes are often utilized when manufacturing optical devices, such as waveguides, flat optical devices, metasurfaces, color-filters, and anti-reflective coatings. Optical devices are engineered to exhibit a high refractive index and low absorption loss properties. During optical device formation, temperature control and scratch reduction assist in improving optical device performance.

Substrate carriers are utilized which mimic the size and shape of a larger substrate, which the processing chambers are configured to process, while a smaller substrate is being processed. Substrate carriers are similar in composition to a substrate and hold the substrate as the substrate passes between different processing chambers and transfer chambers. However, substrate carriers are limited in ability to clamp a substrate. Vacuum chucking is utilized to clamp the substrate carrier to a substrate support, but substrates within the substrate carriers are either un-chucked or utilize other clamping mechanisms, which may impede deposition or other process operations on a top surface of the substrate.

Therefore, there is a need to improve clamping of substrates while utilizing substrate carriers.

SUMMARY

The present disclosure generally relates to substrate carriers, configured for use during semiconductor processing. In one embodiment, the substrate carrier includes a first sheet. The first sheet includes a first top surface, a first bottom surface, and a plurality of outer openings formed between the first top surface and the first bottom surface and around a central axis normal to the first top surface. The substrate carrier further includes a second sheet disposed on top of the first sheet. The second sheet includes a second top surface, a second bottom surface, and a plurality of radial passages extending radially outward from the central axis. An outer distal end of each radial passage of the plurality of radial passages overlaps one or more of the plurality of outer openings while an inner distal end of each radial passage is radially inward of the one or more of the plurality of outer openings. The substrate carrier further includes a third sheet. The third sheet is disposed on top of the second sheet. The third sheet includes a third top surface, a third bottom surface, a plurality of inner openings formed between the third top surface and the third bottom surface and around the central axis and overlapping the inner distal end of one or more of the plurality of radial passages. One or more pocket segments are disposed on top of the third sheet radially outward from the plurality of inner openings and arranged to form a substrate pocket.

In another embodiment, a substrate carrier is described which includes a bottom surface and a top surface. A plurality of outer openings are formed from the bottom surface and around a central axis normal to the top surface. A plurality of radial passages extend radially outward from the central axis. An outer distal end of each radial passage of the plurality of radial passages overlaps one or more of the plurality of outer openings, while an inner distal end of each radial passage is radially inward of the one or more of the plurality of outer openings. A plurality of inner openings are formed from the top surface and around the central axis and overlapping the inner distal end of one or more of the plurality of radial passages. One or more pocket segments are disposed on the top surface, the one or more pocket segments comprising an inner surface disposed radially outward from the plurality of inner openings and radially inward of the plurality of outer openings. The one or more pocket segments are arranged to form a substrate pocket.

In yet another embodiment, a substrate carrier is described which includes a first sheet. The first sheet includes a first top surface, a first bottom surface, a first outer surface having an outer radius of about 147 mm to about 153 mm, and a plurality of outer openings formed between the first top surface and the first bottom surface and centered around a central axis. The substrate carrier further includes a second sheet disposed on top of the first sheet. The second sheet includes a second top surface, a second bottom surface, and a plurality of radial passages extending radially outward from the central axis. The plurality of radial passages are fluidly coupled to one or more of the plurality of outer openings while an inner distal end of each radial passage is radially inward of the one or more of the plurality of outer openings. The substrate carrier further includes a third sheet disposed on top of the second sheet. The third sheet includes a third top surface, a third bottom surface, a plurality of inner openings formed between the third top surface and the third bottom surface and around the central axis and overlapping the inner distal end of one or more of the plurality of radial passages, and an upper central opening radially inward of the plurality of inner openings. The central axis passes through the upper central opening. One or more pocket segments are disposed on top of the third sheet radially outward from the plurality of inner openings and arranged to form a substrate pocket. The substrate pocket has a pocket radius of about 50 mm to about 105 mm.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIG. 2A is a schematic plan view of a substrate carrier, according to a first embodiment described herein.

FIG. 2B is a schematic plan view of a substrate carrier, according to a second embodiment described herein.

FIG. 5A is a schematic plan view of a third sheet of the substrate carrier of FIG. 2A, according to embodiments described herein.

FIG. 5B is a schematic plan view of a third sheet of the substrate carrier of FIG. 2B, according to embodiments described herein.

FIG. 6 is a schematic plan view of a pocket segment of FIG. 2A or FIG. 2B, according to embodiments described herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure is directed towards a substrate carrier with improved substrate clamping and reduced substrate movement. To run small substrate sizes in a system configured for larger wafer sizes, substrate carriers similar to those described herein are utilized. The substrate carrier is used to transfer and process smaller sized substrates. While previous substrate carriers have poor clamping of the substrate and/or are detrimental to processing of the substrate, aspects disclosed herein improve upon one or more of these deficiencies.

The substrate carrier described herein enables improved substrate chucking by enabling backside vacuum chucking of the substrate. Backside vacuum chucking of the substrate is performed through the substrate carrier and holds the substrate in place during processing. Vacuum chucking the substrate reduces scratching caused by shifting of the substrate and enables processing without a mechanical gripper, which would impede process performance, for a variety of substrate processing operations. The substrate carrier described herein may be used for one or more of a deposition process, an etching process, and an annealing processes. Deposition processes include atomic layer deposition (ALD), chemical vapor deposition (CVD), and physical vapor deposition (PVD). Etching processes include dry etching processes such as reactive ion etching (RIE). Annealing processes include rapid thermal processing (RTP) or furnace processing. Other processes which utilize vacuum chucking to improve processing results may also benefit from the substrate carrier as described herein.

Figure 1:
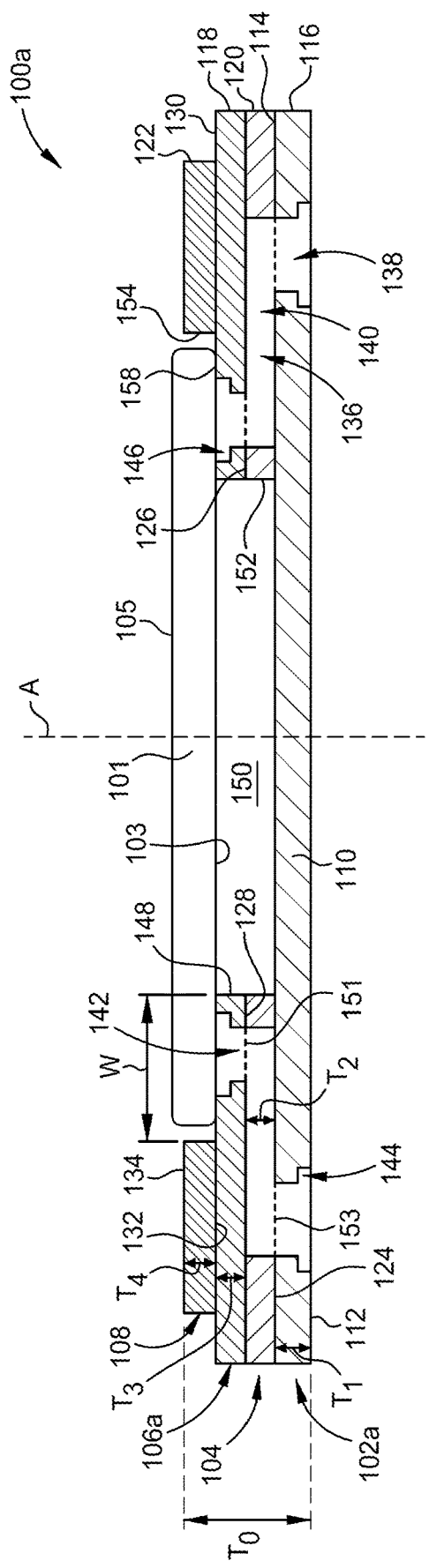
FIG. 1 is a schematic cross sectional view of a substrate carrier, according to embodiments described herein.

FIG. 1 is a schematic cross sectional view of a substrate carrier 100a. The substrate carrier 100a includes a first sheet 102a, a second sheet 104 disposed on top of the first sheet 102a, a third sheet 106a disposed on top of the second sheet 104, and one or more pocket segments 108 disposed on top of the third sheet 106a. The sheets 102a, 104, and 106a each include one portion of a vacuum transfer tunnel 140.

Each of the first sheet 102a, the second sheet 104, the third sheet 106a, and the pocket segments 108 are formed from a material similar to the material of an optical device, such that the substrate carrier 100a is configured to mimic an optical device during processing. In some embodiments, the substrate carrier 100a is a glass material, such as a silicon or a silicon dioxide material.

The vacuum transfer tunnel 140 enables vacuum chucking of a bottom surface 103 of a substrate 101 within the substrate carrier 100a. The substrate 101 positioned within the substrate carrier 100a has a diameter less than the diameter of a vacuum passage on a substrate support chuck (not shown). The vacuum transfer tunnel 140 is configured to enable vacuum chucking of smaller diameter substrates than a substrate support chuck is originally configured to chuck. The diameter of the vacuum transfer tunnels 140 therefore decreases from a first bottom surface 112 of the first sheet 102a to a third top surface 130 of the third sheet 106a.

The first sheet 102a is a planar sheet 110 and includes the first bottom surface 112, a first top surface 114, and a plurality of outer openings 138 formed between the first top surface 114 and the first bottom surface 112. The plurality of outer openings 138 are evenly spaced around a central axis A. The central axis A is normal to the first top surface 114 and the first bottom surface 112. Each outer opening 138 of the plurality of outer openings 138 is disposed at a similar radial position around the central axis A. The first bottom surface 112 and the first top surface 114 are radially inward of a first outer surface 116 of the first sheet 102a. The first outer surface 116 is the most radially outward wall of the first sheet 102a and forms a vertical wall parallel to the central axis A.

The outer openings 138 further include a sealing groove 144 formed around the outer opening 138. The sealing groove 144 is a groove formed in the first bottom surface 112 and around the outer openings 138. The sealing groove 144 may be configured to receive a sealing ring (not shown), such as a gasket ring or an O-ring.

The second sheet 104 is disposed on the first top surface 114 of the first sheet 102a. The second sheet 104 includes a second bottom surface 124 and a second top surface 126. The second sheet 104 is an annular sheet, such as a ring. The second sheet 104 includes a lower portion of a central opening 150 of the substrate carrier 100a. The lower portion of the central opening 150 is also referred to as a lower central opening and is the opening formed by a second inner wall 152 of the second sheet 104. The central opening 150 and the second inner wall 152 are centered about the central axis A, such that the central axis A passes through the central opening 150 and the second inner wall 152 is parallel to (and optionally concentric with) the central axis A.

A plurality of radial passages 136 extend radially outward from the central axis A. The outer distal end of each radial passage 136 overlaps one or more of the plurality of outer openings 138 and is in fluid communication therewith. An inner distal end of each radial passage is disposed radially inward of one or more outer openings 138 of the plurality of outer openings 138. The inner distal end of each radial passage is further radially outward from the second inner wall 152 and the central opening, such that the plurality of radial passages 136 are not in fluid communication with the central opening 150. The plurality of radial passages 136 form a spoke-like pattern extending outward from the central axis A. The plurality of radial passages 136 are openings formed from the second top surface 126 to the second bottom surface 124, such that the length of each of the radial passages 136 is an opening between the second top surface 126 and the second bottom surface 124.

The second bottom surface 124 and the second top surface 126 are radially inward of a second outer surface 120 of the second sheet 104. The second outer surface 120 is the most radially outward wall of the second sheet 104 and forms a vertical wall parallel to the central axis A.

The third sheet 106a is disposed on the second top surface 126 of the second sheet 104. The third sheet 106a includes a third bottom surface 128 and a third top surface 130. The third sheet 106a is an annular sheet, such as a ring. The third sheet 106a includes an upper portion of the central opening 150 of the substrate carrier 100a. The upper portion of the central opening 150 is also referred to as an upper central opening and is the opening formed by a third inner wall 148 of the third sheet 106a. The central opening 150 and the third inner wall 148 are centered about the central axis A, such that the central axis A passes through the central opening 150 and the third inner wall 148 is parallel to (and optionally concentric with) the central axis A.

A plurality of inner openings 142 are formed between the third top surface 130 and the third bottom surface 128. The plurality of inner openings 142 are either grouped or evenly spaced around a central axis A. Each inner opening 142 of the plurality of inner openings 142 is disposed at a similar radial position around the central axis A. The inner openings 142 further include a sealing groove 146 formed around the inner opening 142. The sealing groove 146 is a groove formed in the third top surface 130 and around the inner openings 142. The sealing groove 146 may be configured to receive a sealing ring (not shown), such as a gasket ring or an O-ring.

In some embodiments, the third bottom surface 128 and the third top surface 130 are radially inward of a third outer surface 118 of the third sheet 106a. The third outer surface 118 forms a vertical wall parallel to the central axis A. Each of the first outer surface 116, the second outer surface 120, and the third outer surface 118 have a similar outer diameter.

The one or more pocket segments 108 are disposed on top of and contact the third top surface 130 of the third sheet 106a. The one or more pocket segments 108 are disposed radially outward from the plurality of inner openings 142 and are arranged to form a substrate pocket, such as the substrate pocket 206 of FIG. 2A and FIG. 2B. Each of the one or more pocket segments 108 include a segment top surface 134 and a segment bottom surface 132. Each of the one or more pocket segments 108 further includes an outer segment surface 122 and an inner pocket surface 154. The segment top surface 134 and the segment bottom surface 132 are disposed between the outer segment surface 122 and the inner pocket surface 154.

The substrate 101 is positioned on the third top surface 130 and radially inward of the inner pocket surface 154. A portion of the third top surface 130 which forms the substrate pocket 206 forms a ledge 158 on which the substrate 101 is positioned. The ledge 158 is formed from the inner pocket surface 154 to the third inner wall 148. The ledge 158 has a width W in the radial direction. The width W of the ledge 158 is about 0.5 mm to about 10 mm, such as about 2 mm to about 6 mm, such as about 4 mm to about 5 mm. The ledge 158 forms the bottom surface of the substrate pocket 206, while the inner pocket surface 154 forms the side of the substrate pocket 206. The inner openings 142 are formed through the ledge 158 of the third top surface 130, such that the inner openings 142 are positioned and sized to be beneath the substrate 101 and enable a vacuum to be applied to the bottom surface 103 of the substrate 101. While the vacuum is applied to the bottom surface 103 of the substrate 101, a top surface 105 is able to be left exposed to facilitate processing.

The cross-sectional area of each of the inner openings 142, the outer openings 138, and the radial passages 136 of the vacuum transfer tunnels 140 is sized to enable a vacuum seal of the substrate 101 within the substrate pocket 206. The minimum cross-sectional area of each radial passage 136 of the vacuum transfer tunnels 140 through the substrate carrier 100a is about 2 mm$^2$ to about 15 mm$^2$, such as about 3 mm$^2$ to about 10 mm$^2$, such as about 3.5 mm$^2$ to about 5 mm$^2$.

The intersection of the plurality of radial passages 136 and the plurality of inner openings 142 forms an upper intersection 151. The upper intersection 151 is the point at which the radially inward portion of the plurality of radial passages 136 and the bottom of the inner openings 142 intersect. The upper intersection 151 has a cross-sectional area. The cross-sectional area of the upper intersection 151 is configured to enable vacuum chucking of the substrate 101. The total cross-sectional area of the upper intersection 151 is about 5 mm$^2$ to about 45 mm$^2$, such as about 7 mm$^2$ to about 30 mm$^2$, such as about 10 mm$^2$ to about 15 mm$^2$.

The intersection of the plurality of radial passages 136 and the plurality of outer openings 138 forms a lower intersection 153. The lower intersection 153 is the point at which the radially outward portion of the plurality of radial passages 136 and the top of the outer openings 138 intersect. The lower intersection 153 has a cross-sectional area. The cross-sectional area of the lower intersection 153 is configured to enable vacuum chucking of the substrate 101. The total cross-sectional area of the lower intersection 153 is about 5 mm$^2$ to about 45 mm$^2$, such as about 7 mm$^2$ to about 30 mm$^2$, such as about 10 mm$^2$ to about 15 mm$^2$. The cross-sectional area of each portion of the vacuum transfer tunnels 140 is configured to enable vacuum chucking of the substrate. With smaller cross-sectional areas, vacuum losses have been shown to occur. Vacuum losses reduce the overall effectiveness of the vacuum chucking of the substrate carrier 100a.

The substrate carrier 100a has a carrier thickness $T_0$ of less than about 2.0 mm, such as less than about 1.9 mm, such as about 1.5 mm to about 1.9 mm, such as about 1.7 mm to about 1.8 mm. The carrier thickness $T_0$ is the total thickness of the substrate carrier 100a from the first bottom surface 112 to the segment top surface 134. The first bottom surface 112 may be referred to as the bottom surface of the substrate carrier 100a, while the third top surface 130 may be referred to as the top surface of the substrate carrier 100a with the one or more pocket segments 108 extending from the top surface of the substrate carrier 100a.

The first sheet 102a has a first thickness $T_1$ of about 0.4 mm to about 1 mm, such as about 0.5 mm to about 0.9 mm, such as about 0.6 mm to about 0.8 mm, such as about 0.7 mm. The second sheet 104 has a second thickness $T_2$ of about 0.1 mm to about 0.5 mm, such as about 0.2 mm to about 0.4 mm, such as about 0.3 mm. The third sheet 106a has as third thickness $T_3$ of about 0.1 mm to about 0.5 mm, such as about 0.2 mm to about 0.4 mm, such as about 0.3 mm. Each of the one or more pocket segments 108 have a fourth thickness $T_4$ of about 0.2 mm to about 0.8 mm, such as about 0.3 mm to about 0.7 mm, such as about 0.4 mm to about 0.6 mm, such as about 0.5 mm.

The fourth thickness $T_4$ is chosen to enable a majority of the substrate 101 to be within the substrate pocket 206. The fourth thickness $T_4$ therefore may vary depending on the size of the substrate 101 positioned within the substrate pocket 206. For a 100 mm substrate 101 with a thickness of about 625 μm, the fourth thickness $T_4$ is about 325 μm to about 625 μm. For a 150 mm substrate 101 with a thickness of about 675 μm, the fourth thickness $T_4$ is about 350 μm to about 675 μm. For a 200 mm substrate 101 with a thickness of about 725 μm, the fourth thickness $T_4$ is about 375 μm to about 725 μm.

The first thickness $T_1$, the second thickness $T_2$, and the third thickness $T_3$ are determined to enable support of the substrate 101 without bending of the substrate carrier 100a while reducing the total thickness of the substrate carrier 100a to enable the substrate carrier 100a to fit into existing cassette apparatus and substrate transfer devices without modifying the existing cassette apparatus or substrate transfer devices. The first thickness $T_1$ is thicker than both the second thickness $T_2$ and the third thickness $T_3$ to enable support of the substrate 101 and the other layers of the substrate carrier 100a. The second thickness $T_2$ and the third thickness $T_3$ are large enough to enable machining of the second sheet 104 and the third sheet 106a respectively while not adding a large amount of thickness to the substrate carrier 100a. The total thickness $T_0$ of the substrate carrier 100a is beneficially reduced to enable placement of the substrate carrier 100a within a cassette (not shown) and for transfer of the substrate carrier 100a between process chambers.

The total weight of the substrate carrier 100a without a substrate 101 disposed thereon is less than about 400 grams, such as less than about 300 grams, such as about 150 grams to about 250 grams. The weight of the substrate carrier 100a is configured to be light enough to enable accurate and rapid transfer of the substrate carrier 100a between process chambers and transfer chambers on a transfer device without bending or misalignment of the transfer device. The substrate carrier 100a is also heavy enough to enable a seal between the substrate carrier 100a and the substrate support (not shown).

FIG. 2A is a schematic plan view of the substrate carrier 100a. The plurality of inner openings 142 of the substrate carrier 100a are arcuate openings, such that each of the inner openings 142 forms a block arc or a crescent shape. The inner and outer surfaces of the inner openings 142 form portions of circles which are concentric with the inner pocket surface 154 of the one or more pocket segments 108. The central opening 150 forms a circular pocket radially inward of the inner openings 142 and the one or more pocket segments 108.

The substrate carrier 100a includes at least a first alignment notch 202 in the first top surface 114. The first alignment notch 202 is formed in one or a combination of the first top surface 114 and the first outer surface 116. The first alignment notch 202 is a divot or notch formed to enable accurate alignment of the substrate carrier 100a during carrier assembly as well as during transfer of the substrate carrier 100a between processing chambers.

A second alignment notch 204 is also formed in one or both of the edge of the second top surface 126 and the third top surface 130. The second alignment notch 204 is a divot or notch formed to enable accurate alignment of the substrate carrier 100a during carrier assembly as well as during transfer of the substrate carrier 100a between processing chambers.

The one or more pocket segments 108 in FIG. 2A include four pocket segments 108. The pocket segments 108 may form at least a partial ring around the substrate pocket 206, such that a substrate, such as the substrate 101 positioned within the substrate pocket 206 is held in place by the one or more pocket segments 108. In some embodiments, the one or more pocket segments 108 are a single ring which forms the substrate pocket 206. In other embodiments, the one or more pocket segments 108 includes two pocket segments 108, three pocket segments 108, or five pocket segments 108.

The second inner wall 152 and the third inner wall 148 form an inner wall of the central opening 150. At least the third inner wall 148 has a first radius $R_1$. The first radius $R_1$ is less than the radius of a substrate positioned within the substrate pocket 206. The first radius $R_1$ is less than the radius of the substrate by about 1 mm to about 10 mm, such as about 2 mm to about 8 mm, such as about 3 mm to about 5 mm. The first radius $R_1$ changes depending on the size of the substrate within the substrate pocket 206. When a 100 mm substrate is utilized, the first radius $R_1$ is about 40 mm to about 49 mm, such as about 42 mm to about 48 mm, such as about 45 mm to about 48 mm. When a 150 mm substrate is utilized, the first radius $R_1$ is about 65 mm to about 74 mm, such as about 68 mm to about 73, such as about 70 mm to about 72 mm. When a 200 mm substrate is utilized, the first radius $R_1$ is about 90 mm to about 99 mm, such as about 92 mm to about 98 mm, such as about 95 mm to about 97 mm.

An inside edge 502 (FIG. 5A) of each of the plurality of inner openings 142 has a second radius $R_2$. The second radius $R_2$ is greater than the first radius but less than the radius of a substrate positioned within the substrate pocket 206. The inside edge 502 is the radially inward edge of the inner openings 142. The second radius $R_2$ is greater than the first radius $R_1$ by about 0.5 mm to about 8 mm, such as about 1 mm to about 5 mm, such as about 1 mm to about 3 mm. The second radius $R_2$ is chosen to enable the inner openings 142 to form a seal with the bottom surface of a substrate. When a 100 mm substrate is utilized, the second radius $R_2$ is about 40 mm to about 48 mm, such as about 42 mm to about 47 mm, such as about 45 mm to about 47 mm. When a 150 mm substrate is utilized, the second radius $R_2$ is about 65 mm to about 74 mm, such as about 70 mm to about 73, such as about 71 mm to about 73 mm. When a 200 mm substrate is utilized, the second radius $R_2$ is about 91 mm to about 98 mm, such as about 94 mm to about 97 mm, such as about 95 mm to about 97 mm.

An outside edge 504 (FIG. 5A) of each of the plurality of inner openings 142 has a third radius $R_3$. The third radius $R_3$ is greater than the second radius $R_2$ and the first radius $R_2$. The third radius $R_3$ is about 0.5 mm to about 5 mm greater than the second radius $R_2$, such as about 1 mm to about 4 mm greater than the second radius $R_2$, such as about 1 mm to about 2 mm greater than the second radius $R_2$. The third radius $R_3$ is greater than the first radius $R_1$ by about 1 mm to about 9 mm, such as about 2 mm to about 8 mm, such as about 2 mm to about 5 mm. When a 100 mm substrate is utilized, the third radius $R_3$ is about 42 mm to about 48 mm, such as about 43 mm to about 47 mm, such as about 44 mm to about 47 mm. When a 150 mm substrate is utilized, the third radius $R_3$ is about 68 mm to about 74 mm, such as about 70 mm to about 74 mm, such as about 72 mm to about 73 mm. When a 200 mm substrate is utilized, the third radius $R_3$ is about 93 mm to about 99 mm, such as about 94 mm to about 99 mm, such as about 96 mm to about 99 mm.

The fourth radius $R_4$ is the radius of the substrate pocket 206. The fourth radius $R_4$ is larger than the radius of a substrate positioned in the substrate pocket 206 by about 0.1 mm to about 5 mm, such as about 0.2 mm to about 2 mm, such as about 0.3 mm to about 1.0 mm, such as about 0.4 mm to about 0.7 mm. The fourth radius $R_4$ is the same as a fifth radius $R_5$. The fifth radius $R_5$ is the radius of the inner pocket surface 154. The fourth radius $R_4$ and the fifth radius $R_5$ are greater than the third radius $R_3$ by about 1 mm to about 10 mm, such as about 2 mm to about 9 mm, such as about 2 mm to about 5 mm, such as about 2 mm to about 4 mm. When a 100 mm substrate is utilized, the fourth radius $R_4$ and the fifth radius $R_5$ are about 50 mm to about 60 mm, such as about 51 mm to about 58 mm, such as about 51 mm to about 55 mm. When a 150 mm substrate is utilized, the fourth radius $R_4$ and the fifth radius $R_5$ are about 75 mm to about 85 mm, such as about 76 mm to about 82 mm, such as about 76 mm to about 80 mm. When a 200 mm substrate is utilized, the fourth radius $R_4$ and the fifth radius $R_5$ is about 100 mm to about 110 mm, such as about 101 mm to about 108 mm, such as about 101 mm to about 105 mm.

A sixth radius $R_6$ is the radius of the third outer surface 118 and/or the second outer surface 120. The sixth radius $R_6$ is greater the fifth radius $R_6$. A seventh radius $R_7$ is the radius of the first outer surface 116. The seventh radius $R_7$ is the radius of the substrate which the processing chamber is configured to process. As the substrate carrier 100a is configured to mimic the size and shape of a 300 mm substrate, the seventh radius $R_7$ is about 298 mm to about 302 mm, such as about 299 mm to about 301 mm, such as about 300 mm. The sixth radius $R_6$ is less than or equal to the seventh radius $R_7$. In the embodiment of FIG. 2A, the sixth radius $R_6$ is less than the seventh radius $R_7$. The sixth radius $R_6$ is about 5 mm to about 50 mm less than the seventh radius $R_7$.

In the substrate carrier 100a of FIG. 2A, each of the inner openings 142 and the outer openings 138 are configured to be in fluid communication with multiple radial passages 136, such that the vacuum applied to the substrate through the vacuum transfer tunnel is distributed across the inner openings 142 and a larger portion of the bottom surface of a substrate.

In the embodiment of FIG. 2B, the sixth radius $R_6$ and the seventh radius $R_7$ are about the same, such that the sixth radius $R_6$ is within 5 mm of the seventh radius $R_7$. FIG. 2B is a schematic plan view of a substrate carrier 100b, according to a second embodiment. The substrate carrier 100b is similar to the substrate carrier 100a of FIG. 2A, but the plurality of inner openings 142 are rounded or ovoid, such that the plurality of inner openings 142 are a plurality of rounded inner openings 208. Each of the rounded inner openings 208 includes a sealing groove 210 surrounding the rounded inner openings 208. The sealing groove 210 is configured to receive a sealing ring, such as a gasket or an O-ring.

Figure 3B:
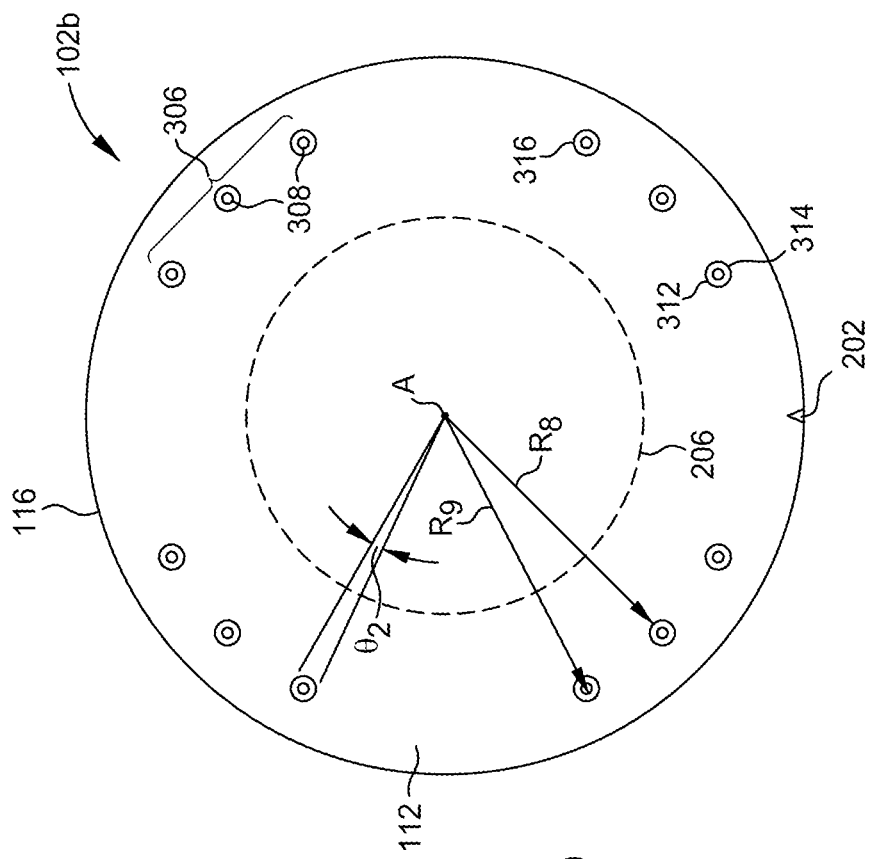
FIG. 3B is a schematic bottom plan view of a first sheet of the substrate carrier of FIG. 2B, according to embodiments described herein.

A single rounded inner opening 208 is configured to be in fluid communication with each of the radial passages 136. The single rounded inner openings 208 have an inner surface 214 and an outer surface 216. The inner surface 214 has a radius similar to the second radius $R_2$. The outer surface 216 has a radius similar to the third radius $R_3$. The rounded inner openings 208 may be evenly spaced around the central axis A or the rounded inner openings 208 are grouped into a plurality of inner opening sets 212. Each inner opening set 212 includes multiple rounded inner openings 208, such as two rounded inner openings 208, three rounded inner openings 208, or four rounded inner openings 208. In the embodiment of FIG. 2B, the outer openings 138 are also replaced with rounded outer openings 308 as shown in FIG. 3B.

Figure 3A:
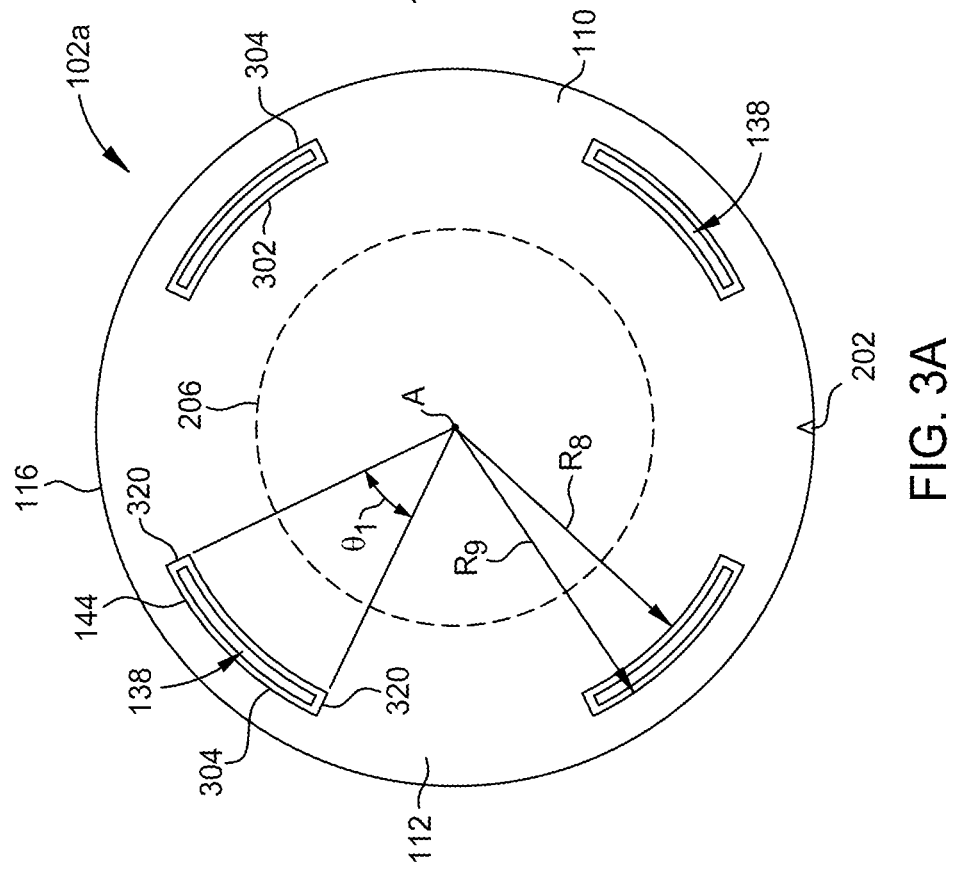
FIG. 3A is a schematic bottom plan view of a first sheet of the substrate carrier of FIG. 2A, according to embodiments described herein.

FIG. 3A is a schematic bottom plan view of the first sheet 102a of a substrate carrier. The outer openings 138 of the first sheet 102a are arcuate openings, such that each of the outer openings 138 forms a block arc or a crescent shape. An inside edge 302 and an outside edge 304 of the outer openings 138 form portions of circles which are concentric with the inner pocket surface 154 of the one or more pocket segments 108 and centered about the central axis A.

The inside edge 302 of each of the outer openings 138 has an eighth radius $R_8$. The outside edge 304 of each of the outer openings 138 has a ninth radius $R_9$. The eighth radius $R_8$ and the ninth radius $R_9$ are configured such that the outer openings 138 are formed over one or more vacuum passages within a substrate support chuck or a vacuum chuck. The eighth radius $R_8$ is about 290 mm to about 299 mm, such as about 294 mm to about 299 mm, such as about 295 mm to about 298 mm. The ninth radius $R_9$ is about 292 mm to about 299 mm, such as about 295 mm to about 299 mm, such as about 297 mm to about 298 mm.

Each of the outer openings 138 have side edges 320 between the inside edge 302 and the outside edge 304. The side edges 320 are oriented along a radius of the first sheet 102a from the central axis A. Each side edge of the outer openings 138 are disposed at different angular locations about the central axis A. A first central angle $\theta_1$ of the outer openings 138 is the angular difference between a first side edge 320 and a second side edge 320 of the outer openings 138. The first central angle $\theta_1$ is about 5 degrees to about 60 degrees, such as about 10 degrees to about 45 degrees. In some embodiments, each of outer openings 138 only intersect one of the radial passages 136, such that the first central angle $\theta_1$ is about 0.1 degrees to about 1 degree, such as about 0.3 degrees to about 0.5 degrees, such as about 0.4 degrees to about 0.5 degrees.

FIG. 3B is a schematic bottom plan view of a first sheet 102b of the substrate carrier 100b of FIG. 2B. The first sheet 102b is similar to the first sheet 102a of FIG. 3A, but the outer openings 138 are replaced with rounded outer openings 308. The rounded outer openings 308 are circular or ovoid, such that a cross section of each of the rounded outer openings 308 through a plane normal to the central axis A is a circle, an oval, or an ellipse. The rounded outer openings 308 may enable greater vacuum chucking at smaller points around a substrate. More precise vacuum chucking enables some points on the substrate to stay chucked even if other adjacent rounded outer openings 308 become unsealed. Each of the rounded outer openings 308 include a sealing groove 316 formed around the rounded outer opening 308 along the first bottom surface 112.

Similar to the outer openings 138 of FIG. 3A, each of the rounded outer openings 308 include an inside edge 312 and an outside edge 314. The inside edge 312 is disposed at the eighth radius $R_8$ from the central axis A. The outside edge 314 is disposed at the ninth radius $R_9$ from the central axis A. A second central angle $\theta_2$ of the rounded outer openings 308 is the angular difference between the sides of the outer openings 138. The second central angle $\theta_2$ is about 0.1 degrees to about 1 degree, such as about 0.3 degrees to about 0.5 degrees, such as about 0.4 degrees to about 0.5 degrees.

The rounded outer openings 308 may be evenly spaced around the central axis A or the rounded outer openings 308 may be grouped into outer opening sets 306. In some embodiments, the difference in angular position between a radial centerline through each of the rounded outer openings 308 is about 30 degrees to about 70 degrees, such as about 35 degrees to about 65 degrees. Each outer opening set 306 includes multiple rounded outer openings 308, such as two rounded outer openings 308, three rounded outer openings 308, or four rounded outer openings 308. There may be an angle of about 50 degrees to about 70 degrees from between each outer opening set 306, such that the closest adjacent rounded outer opening 308 of a second outer opening set 306 with respect to a first outer opening set 306 is about 50 degrees to about 70 degrees around the central axis A.

Figure 4:
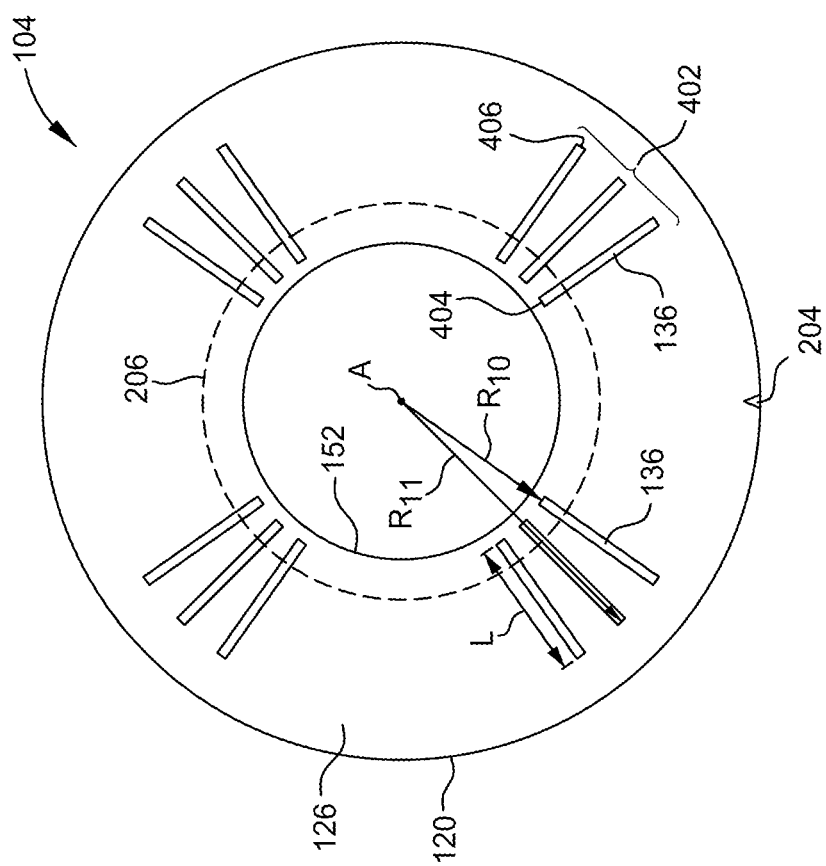
FIG. 4 is a schematic plan view of a second sheet of the substrate carrier of FIG. 2A or FIG. 2B, according to embodiments described herein.

FIG. 4 is a schematic plan view of the second sheet 104 of the substrate carrier of FIG. 2A or FIG. 2B. Each of the radial passages 136 includes an inner distal end 404 and an outer distal end 406 relative to the central axis. The radial passages 136 form radial openings from the central axis A, such that the openings extend from the inner distal end 404 to the outer distal end 406. Each of the radial passages 136 have a length L. The length L extends along a radial direction from the inner distal end 404 to the outer distal end 406. The length L is about 45 mm to about 175 mm, such as about 50 mm to about 150 mm, such as about 50 mm to about 125 mm.

The inner distal end 404 of each radial passage 136 is positioned at a tenth radius $R_{10}$ from the central axis A. The outer distal end 406 of each radial passage 136 is positioned at an eleventh radius $R_{11}$ from the central axis A. The tenth radius $R_{10}$ varies to accommodate difference sized substrates and different sized substrate pockets 206. The tenth radius $R_{10}$ is less than the fourth radius $R_4$ and the fifth radius $R_5$, such that the radial passage 136 extends below the substrate pocket 206.

When a 100 mm substrate is utilized, the tenth radius $R_{10}$ is about 40 mm to about 48 mm, such as about 42 mm to about 47 mm, such as about 45 mm to about 47 mm. When a 150 mm substrate is utilized, the tenth radius $R_{10}$ is about 65 mm to about 74 mm, such as about 70 mm to about 73, such as about 71 mm to about 73 mm. When a 200 mm substrate is utilized, the tenth radius $R_{10}$ is about 91 mm to about 98 mm, such as about 94 mm to about 97 mm, such as about 95 mm to about 97 mm. The eleventh radius $R_{11}$ is greater than the tenth radius $R_{10}$. The eleventh radius $R_{11}$ is about 292 mm to about 299 mm, such as about 295 mm to about 299 mm, such as about 297 mm to about 298 mm.

The radial passages 136 may be evenly spaced around the central axis A or may be grouping. When the radial passages 136 are grouped, the radial passages 136 form radial passage sets 402. Each radial passage sets 402 includes multiple radial passages 136, such as two radial passages 136, three radial passages 136, or four radial passages 136. Each radial passage set 402 may be associated with a single outer opening 138 and a single inner opening 142 when the substrate carrier 100 is configured with arcuate outer openings 138 and arcuate inner openings 142.

FIG. 5A is a schematic plan view of the third sheet 106a of the substrate carrier 100a of FIG. 2A. The inner openings 142 of the third sheet 106a are arcuate openings, such that each of the inner openings 142 forms a block arc or a crescent shape. An inside edge 502 and an outside edge 504 of the inner openings 142 form portions of circles which are concentric with the inner pocket surface 154 of the one or more pocket segments 108 and centered about the central axis A.

Each of the inner openings 142 have side edges 506 between the inside edge 502 and the outside edge 504. The side edges 506 are oriented along a radius of the third sheet 106a from the central axis A. Each side edge 506 of the inner openings 142 are disposed at different angular locations about the central axis A. A third central angle $\theta_3$ of the inner openings 142 is the angular difference between a first side edge 506 and a second outer edge 506 of the inner openings 142. The third central angle $\theta_3$ is about 5 degrees to about 60 degrees, such as about 10 degrees to about 45 degrees. In some embodiments, each of inner openings 142 only intersect one of the radial passages 136, such that the third central angle $\theta_3$ is about 0.1 degrees to about 1 degree, such as about 0.3 degrees to about 0.5 degrees, such as about 0.4 degrees to about 0.5 degrees.

The inner openings 142 are positioned within the substrate pocket 206, such that the inside edge 502 and the outside edge 504 are both radially inward of the edge of the substrate pocket 206. The inner openings 142 are configured to enable vacuum sealing of a bottom surface of a substrate. The arcuate shape of the inner openings 142 assists in distributing the vacuum force applied to the substrate.

FIG. 5B is a schematic plan view of a third sheet 106b of the substrate carrier of FIG. 2B. The third sheet 106b is similar to the third sheet 106a of FIG. 5A, but the inner openings 142 are replaced with rounded inner openings 508. The rounded inner openings 508 are circular or ovoid, such that a cross section of each of the rounded inner openings 508 through a plane normal to the central axis A is a circle, an oval, or an ellipse. The rounded inner openings 508 may enable greater vacuum chucking at smaller points around a substrate. More precise vacuum chucking enables some points on the substrate to stay chucked even if other adjacent rounded inner openings 508 become unsealed. Each of the rounded inner openings 508 include a sealing groove 512 formed around the rounded inner opening 508 along the third top surface 130.

Similar to the inner openings 142 of FIG. 5A, each of the rounded inner openings 508 include an inside edge 514 and an outside edge 516. The inside edge 514 is disposed at a similar radial position to the inside edge 502 and the outside edge 516 is disposed at a similar radial position to the outside edge 504. A fourth central angle $\theta_4$ of the rounded inner openings 508 is the angular difference between the sides of the rounded inner openings 508. The fourth central angle $\theta_4$ is about 0.1 degrees to about 1 degree, such as about 0.3 degrees to about 0.5 degrees, such as about 0.4 degrees to about 0.5 degrees.

The rounded inner openings 508 may be evenly spaced around the central axis A or the rounded inner openings 508 may be grouped into rounded inner opening sets 510. Each rounded inner opening set 510 includes multiple rounded inner openings 508, such as two rounded inner openings 508, three rounded inner openings 508, or four rounded inner openings 508. In some embodiments, the difference in angular position between a radial centerline through each of the rounded inner openings 510 is about 30 degrees to about 70 degrees, such as about 35 degrees to about 65 degrees. There may be an angle of about 50 degrees to about 70 degrees from between each rounded inner opening set 510, such that the closest adjacent rounded inner opening 508 of a second rounded inner opening set 510 with respect to a first rounded inner opening set 510 is about 50 degrees to about 70 degrees around the central axis A.

FIG. 6 is a schematic plan view of a pocket segment 108 of FIG. 2A or FIG. 2B. The pocket segment 108 is an arcuate component, such that the pocket segment 108 forms a block arc or a crescent shape. The inner pocket surface 154 and the outer segment surface 122 are on opposite sides of the pocket segment 108, such that the inner pocket surface 154 forms a first arc with a radius similar to the fifth radius $R_5$. The inner pocket surface 154 includes a notch therein, such as an alignment notch 604. The alignment notch 604 may also be described as a divot or a recess. The alignment notch 604 is configured to enable alignment of the pocket segments 108 with the substrate pocket 206, the first sheet 102a, the second sheet 104, and the third sheet 106a. The alignment notch 604 is formed within the center of the inner pocket surface 154 and recessed towards the outer pocket surface 122. The outer segment surface 122 forms an outside surface of the pocket segment 108. The outer segment surface 122 is concentric with the inner pocket surface 154.

Each of the pocket segments 108 further includes side surfaces 602. The side surfaces 602 are disposed between the inner pocket surface 154 and the outer segment surface 122, such that the side surfaces 602 connect the inner pocket surface 154 and the outer segment surface 122. The side surfaces 602 are oriented in a radial direction with respect to the central axis A.

Figure 7A:
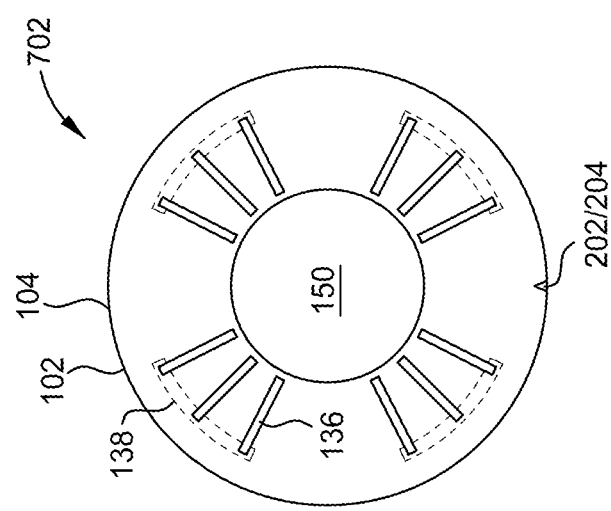
FIGS. 7A-7C are schematic plan views of the substrate carrier of FIG. 1 during various states of assembly, according to embodiments described herein.
Figure 7B:
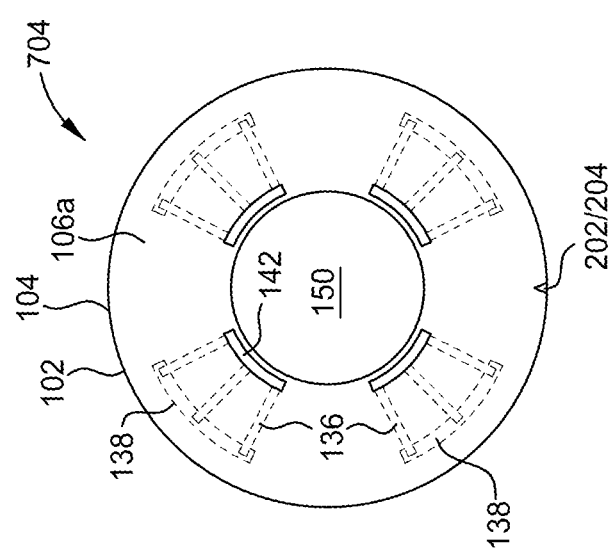
Figure 7C:
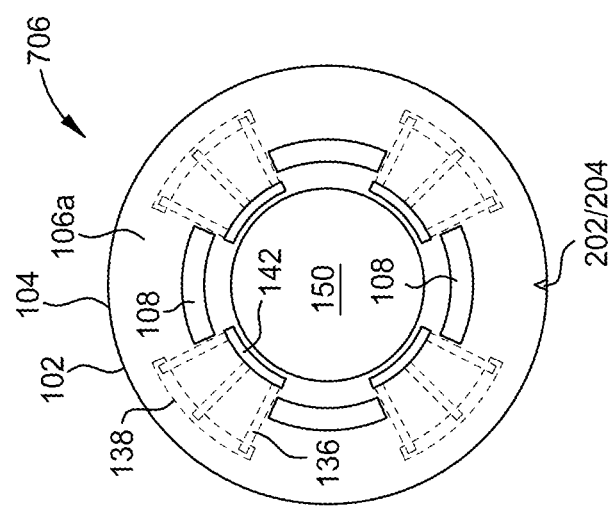
Figure 8:
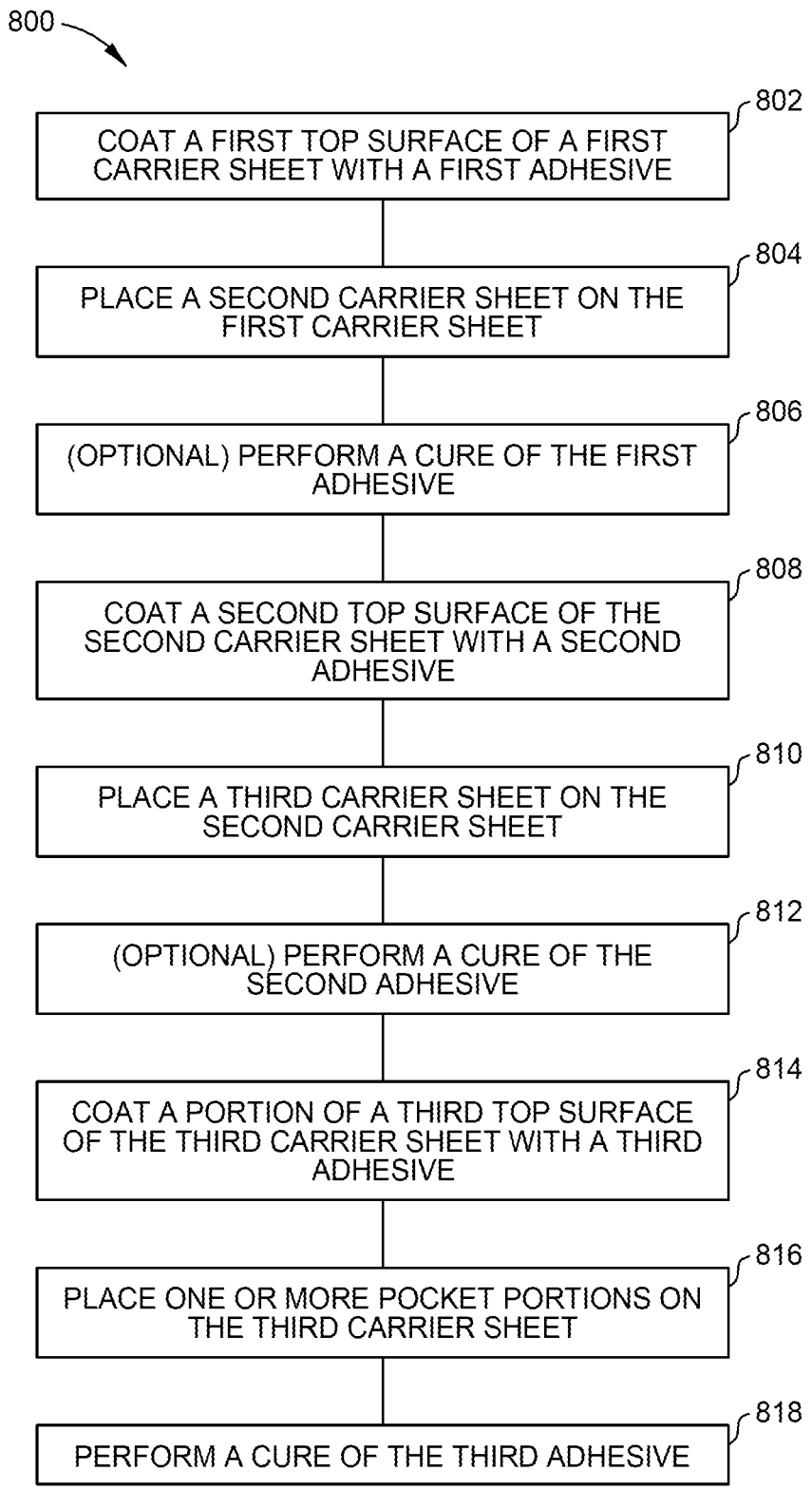
FIG. 8 is a flow diagram illustrating a method of assembling a substrate carrier, such as the substrate carrier of FIGS. 7A-7C, according to embodiments described herein.

FIGS. 7A-7C are schematic plan views of the substrate carrier 100 of FIG. 1 during various states of assembly. FIG. 8 is a flow diagram illustrating a method 800 of assembling the substrate carrier 100. The method 800 includes an operation 802, where a top surface, such as the first top surface 114, of a first carrier sheet, such as one of the first sheets 102a, 102b, is coated with a first adhesive. The first adhesive is a curable optical adhesive, such as an Ultra Violet (UV) cured adhesive. The first adhesive is a clear, colorless, liquid photopolymer. The first adhesive is a Urethane resin based formulation, such that the first adhesive includes Mercapto-ester and Triallyl isocyanuarte. The first adhesive may also be described as an epoxy. In some embodiments, fasteners, such as screws, clamps, or bolts are utilized to fasten portions of the substrate carrier 100 instead of an adhesive.

After the operation 802, a second carrier sheet, such as the second sheet 104, is placed on top of the first carrier sheet during an operation 804. The second carrier sheet is aligned, such that one or more alignment notches, such as the alignment notches 202, 204, are aligned with one another. Aligning the alignment notches helps ensure each of one or more radial passages, such as the radial passages 136, are aligned with at least one of the outer openings, such as the outer openings 138, through the first carrier sheet. The second carrier sheet is placed on top of the first carrier sheet and the first adhesive. A second bottom surface, such as the second bottom surface 124, is disposed on top of and in contact with the first top surface during the operation 804.

After the second carrier sheet is placed on the first carrier sheet during the operation 804, the first adhesive is optionally cured during an operation 806 to form a first carrier sub-assembly 702. The first carrier sub-assembly 702 is illustrates in FIG. 7A. Curing the first adhesive bonds the first carrier sheet and the second carrier sheet, such that the first adhesive is hardened. The curing of the first adhesive is a UV cure or a thermal cure. Therefore, the first adhesive is exposed to heat and/or a UV source by passing the first carrier sub-assembly 702 through a thermal treatment or UV curing chamber/volume.

A second top surface, such as the second top surface 126, of the second carrier sheet is coated with a second adhesive during an operation 808. The operation 808 is performed after either of the operations 804 or 806. The second adhesive is similar to the first adhesive and may be a UV cured adhesive or an epoxy.

After depositing/applying the second adhesive, a third carrier sheet, such as one of the third sheets 106a, 106b, are placed on the second carrier sheet during an operation 810. Placing the third carrier sheet on the second carrier sheet forms a second carrier sub-assembly 704. The second carrier sub-assembly 704 is illustrated in FIG. 7B. A third bottom surface, such as the third bottom surface 128, of the third carrier sheet is positioned on top of and in contact with the second top surface 126. The third carrier sheet is aligned using one or more alignment notches, such as an alignment notch 204. Each of the inner openings 142 are aligned with at least one of the radial passages 136.

After placing the third carrier sheet during the operation 810, the second adhesive is optionally cured during an operation 812 to form the second carrier sub-assembly 704. Curing the second adhesive bonds the second carrier sheet and the third carrier sheet, such that the second adhesive is hardened. The curing of the second adhesive is a UV cure or a thermal cure. Therefore, the second adhesive is exposed to heat and/or a UV source by passing the second carrier sub-assembly 704 through a thermal treatment or UV curing chamber/volume.

After during the second adhesive during the operation 812, a portion of a third top surface, such as the third top surface 130, of the third carrier sheet is coated with a third adhesive during an operation 814. The operation 814 is performed after either of the operations 810 or 812. The third adhesive is similar to the first adhesive and/or the second adhesive, such that the third adhesive is a UV cured adhesive or an epoxy.

After depositing/applying the third adhesive, one or more pocket portions, such as such as the one or more pocket segments 108, are placed on the second carrier sheet during an operation 816. Placing the one or more pocket segments 108 on the third carrier sheet forms a third carrier sub-assembly 706. The third carrier sub-assembly 706 is illustrated in FIG. 7C. A segment bottom surface, such as the segment bottom surface 132, of the one or more pocket portions is positioned on top of and in contact with the third top surface 130. The one or more pocket portions are aligned using one or more alignment notches, such as the alignment notch 604 of FIG. 6. The one or more pocket portions are configured to form a substrate pocket, such as the substrate pocket 206.

After placing the one or more pocket portions on the third carrier sheet, during the operation 816, at least the third adhesive is cured during an operation 818. Curing the third adhesive bonds the third carrier sheet and the one or more pocket portions, such that the third adhesive is hardened. The curing of the third adhesive is a UV cure or a thermal cure. Therefore, the third adhesive is exposed to heat and/or a UV source by passing the third carrier sub-assembly 706 through a thermal treatment or UV curing chamber/volume.

In some embodiments, the curing of the first adhesive and the second adhesive during operation 806 and 812 is performed during the operation 818. Therefore, each of the first adhesive, the second adhesive, and the third adhesive are cured simultaneously during the operation 818.

The substrate carriers 100a, 100b described herein are utilized to transfer substrates of various sizes when the processing chambers which are being utilized are configured for a 300 mm substrate. In embodiments described herein, the other sizes of the substrate may be 100 mm substrates, 150 mm substrates, or 200 mm substrates.

The substrate carriers described herein enable vacuum chucking of a substrate even though the components of a substrate support chuck of a processing chamber are not configured to vacuum chuck a smaller substrate. Forming the substrate carrier in multiple layers enables more precise manufacturing without fracturing or cracking of the substrate carrier.

While the foregoing is directed to embodiments of the present disclosure, other and further embodiments of the disclosure may be devised without departing from the basic scope thereof, and the scope thereof is determined by the claims that follow.

What is claimed is:

1. A substrate carrier, configured for use in a semiconductor processing chamber, comprising:
    a first sheet comprising:
        a first top surface;
        a first bottom surface; and
        a plurality of outer openings formed between the first top surface and the first bottom surface and around a central axis normal to the first top surface;
    a second sheet disposed on top of the first sheet comprising:
        a second top surface;
        a second bottom surface; and
        a plurality of radial passages extending radially outward from the central axis, an outer distal end of each radial passage of the plurality of radial passages overlapping one or more of the plurality of outer openings while an inner distal end of each radial passage is radially inward of the one or more of the plurality of outer openings;
    a third sheet disposed on top of the second sheet comprising:
        a third top surface;
        a third bottom surface;
        a plurality of inner openings formed between the third top surface and the third bottom surface and around the central axis and overlapping the inner distal end of one or more of the plurality of radial passages; and
    one or more pocket segments disposed on top of the third top surface sheet radially outward from the plurality of inner openings and arranged to form a substrate pocket, the third top surface at least partially defining a bottom surface of the substrate pocket.

2. The substrate carrier of claim 1, wherein the third sheet further comprises an upper central opening radially inward of the plurality of inner openings and formed through the third top surface and the third bottom surface, such that the central axis passes through the upper central opening.

3. The substrate carrier of claim 2, wherein the second sheet further comprises a lower central opening radially inward of the plurality of inner openings and formed through the second top surface and the second bottom surface, such that the central axis passes through the lower central opening.

4. The substrate carrier of claim 2, wherein the upper central opening has a first radius and an inside surface of the inner openings has a second radius greater than the first radius by about 0.5 mm to about 8 mm.

5. The substrate carrier of claim 4, wherein an outside surface of the inner openings has a third radius and a pocket forming surface of the one or more pocket segments has a fifth radius greater than the third radius by about 1 mm to about 10 mm.

6. The substrate carrier of claim 1, wherein a total thickness of the substrate carrier in a direction parallel to the central axis is less than about 2.0 mm.

7. The substrate carrier of claim 1, wherein each of the first sheet, the second sheet, the third sheet, and the one or more pocket segments comprise silicon.

8. The substrate carrier of claim 7, wherein each of the first sheet is bonded to the second sheet, the third sheet is bonded to the second sheet, and the one or more pocket segments are bonded to the third sheet.

9. The substrate carrier of claim 8, wherein each of the first sheet, the second sheet, the third sheet, and the one or more pocket segments are bonded with a cured adhesive.

10. The substrate carrier of claim 1, wherein the plurality of inner openings is configured to vacuum chuck a substrate to the third top surface within the substrate pocket.

11. A substrate carrier, configured for use in a semiconductor processing chamber, comprising:
    a bottom surface;
    a top surface;
    a plurality of outer openings formed from the bottom surface and around a central axis normal to the top surface;
    a plurality of radial passages extending radially outward from the central axis, an outer distal end of each radial passage of the plurality of radial passages overlapping one or more of the plurality of outer openings while an inner distal end of each radial passage is radially inward of the one or more of the plurality of outer openings;
    a plurality of inner openings formed from the top surface and around the central axis and overlapping the inner distal end of one or more of the plurality of radial passages; and
    one or more pocket segments disposed on the top surface, the one or more pocket segments comprising an inner surface disposed radially outward from the plurality of inner openings and radially inward of the plurality of outer openings, the one or more pocket segments arranged to form a substrate pocket, the top surface at least partially defining a bottom surface of the substrate pocket.

12. The substrate carrier of claim 11, wherein a lower sealing groove is disposed around each of the plurality of outer openings.

13. The substrate carrier of claim 12, wherein an upper sealing groove is disposed around each of the plurality of inner openings.

14. The substrate carrier of claim 11, wherein the substrate carrier further comprises a central opening radially inward of the plurality of inner openings and formed through the top surface, such that the central axis passes through the central opening.

15. The substrate carrier of claim 14, wherein a portion of the top surface between the inner surface and the central opening is a substrate support shelf and the substrate support shelf has a width of about 1 mm to about 10 mm in a radial direction relative to the central axis.

16. The substrate carrier of claim 11, wherein an outer surface of the substrate carrier has an outer radius of about 147 mm to about 153 mm.

17. The substrate carrier of claim 16, wherein the substrate pocket has a pocket radius of about 50 mm to about 105 mm formed by the inner surface of the one or more pocket segments.

18. The substrate carrier of claim 11, wherein the plurality of radial passages have a cross-sectional area of about 2 $mm^2$ to about 15 $mm^2$.

19. The substrate carrier of claim 11, further comprising an alignment notch on an outer surface of the substrate carrier.

20. A substrate carrier, configured for use in a semiconductor processing chamber, comprising:
   a first sheet comprising:
   a first top surface;
   a first bottom surface;
   a first outer surface having an outer radius of about 147 mm to about 153 mm; and
   a plurality of outer openings formed between the first top surface and the first bottom surface and centered around a central axis;
   a second sheet disposed on top of the first sheet comprising:
   a second top surface;
   a second bottom surface; and
   a plurality of radial passages extending radially outward from the central axis, the plurality of radial passages fluidly coupled to one or more of the plurality of outer openings while an inner distal end of each radial passage is radially inward of the one or more of the plurality of outer openings;
   a third sheet disposed on top of the second sheet comprising:
   a third top surface;
   a third bottom surface;
   a plurality of inner openings formed between the third top surface and the third bottom surface and around the central axis and overlapping the inner distal end of one or more of the plurality of radial passages; and
   an upper central opening radially inward of the plurality of inner openings, the central axis passing through the upper central opening; and
   one or more pocket segments disposed on top of the third sheet radially outward from the plurality of inner openings and arranged to form a substrate pocket, the substrate pocket having a pocket radius of about 50 mm to about 105 mm, the third top surface at least partially defining a bottom surface of the substrate pocket.

21. The substrate carrier of claim 20, further comprising:
   a lower sealing groove is disposed around each of the plurality of outer openings; and
   an upper sealing groove is disposed around each of the plurality of inner openings.

* * * * *